US008981488B1

(12) United States Patent
Wen et al.

(10) Patent No.: US 8,981,488 B1
(45) Date of Patent: Mar. 17, 2015

(54) SEMICONDUCTOR STRUCTURE AND INTEGRATED CIRCUIT

(71) Applicant: United Microelectronics Corp., Hsinchu (TW)

(72) Inventors: Yung-Ju Wen, Taoyuan County (TW); Tien-Hao Tang, Hsinchu (TW); Chang-Tzu Wang, Taoyuan County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 14/072,976

(22) Filed: Nov. 6, 2013

(51) Int. Cl.
*H01L 21/70* (2006.01)
*H01L 27/092* (2006.01)

(52) U.S. Cl.
CPC .................................... *H01L 27/092* (2013.01)
USPC ............ 257/369; 257/372; 257/373; 257/374

(58) Field of Classification Search
USPC .................................. 257/369, 372, 373, 374
See application file for complete search history.

(56) References Cited

U.S. PATENT DOCUMENTS

| 6,110,769 | A * | 8/2000 | Son ................................ 438/164 |
| 6,646,305 | B2 * | 11/2003 | Assaderaghi et al. ........ 257/347 |
| 2002/0175377 | A1 * | 11/2002 | Lin ................................ 257/355 |
| 2013/0168772 | A1 | 7/2013 | Wen |

OTHER PUBLICATIONS

Quirk, et al., Semiconductor Manufacturing Technoology, 2001, Prentice Hall, 2nd Ed., pp. 57, ISBN 0-13-081520-9.*
Polgreen, et al., "Improving the ESD Failure Threshold of Silicided n-MOS Output Transistors by Ensuring Uniform Current Flow", Feb. 1992, pp. 379-388, vol. 39, No. 2, IEEE Transactions on Electron Devices.
Amerasekera, et al., "The Impact of Technology Scaling on ESD Robustness and Protection Circuit Design", Jun. 1995, pp. 314-320, vol. 18, No. 2, IEEE Transactions on Components, Packaging, and Manufacturing Technology—Part A.
Lee, et al., "An Analytical Model of Positive H.B.M ESD Current Distribution and The Modified Multi-Finger Protection Structure", 1999, pp. 162-167, Proceedings of 7th IPFA '99, Singapore.
Chen, et al., "Experimental Investigation on the HBM ESD Characteristics of CMOS Devices in a 0.35-pm Silicided Process", 1999, pp. 35-38, VLSI Technology, Systems, and Applications, 1999. International Symposium on, Taiwan.
Amerasekera, et al., "Correlating Drain Junction Scaling, Salicide Thickness, and Lateral NPN Behavior, with the ESD/EOS Performance of a 0.25 pm CILIOS Process.", 1996, pp. IEDM 96-893-896, IEEE.
Bock, et al., "Influence of gate length on ESD-performance for deep sub micron CMOS technology", 1999, pp. 99-95-99-104, EOS/ESD Symposium.
Ker, et al., "Layout Design on Multi-Finger MOSFET for On-Chip ESD Protection Circuits in a 0.18-pM Salicided CMOS Process", 2001, pp. 361-364, IEEE.
Ker, et al., "The Impact of Inner Pickup on ESD Robustness of Multi-Fingernmos in Nanoscale CMOS Technology", 2006, pp. 631-632, IEEE 06CH37728 44th Annual International Reliability Physics Symposiumr San Jose, 2006.

* cited by examiner

*Primary Examiner* — Matthew Reames
*Assistant Examiner* — Vincent Wall
(74) *Attorney, Agent, or Firm* — WPAT, PC; Justin King

(57) ABSTRACT

A semiconductor structure and an integrated circuit are provided. The semiconductor structure includes a first field-effect transistor (FET), a second FET, an isolation structure, and a body electrode. The first FET includes a first active body having a first type conductivity. The second FET includes a second active body having the first type conductivity. The first active body and the second active body are isolated from each other by the isolation structure. The body electrode has the first type conductivity and formed in the second active body.

19 Claims, 2 Drawing Sheets

SEMICONDUCTOR STRUCTURE AND INTEGRATED CIRCUIT

BACKGROUND

1. Technical Field

The disclosure relates to a semiconductor structure and an integrated circuit, and more particularly to a semiconductor structure and an integrated circuit comprising a field-effect transistor.

2. Description of the Related Art

In semiconductor technology, semiconductor chips or circuits having different internal power supply voltages are usually integrated together. A mixed-voltage (for example double voltage) I/O interface comprising field-effect transistors (FETs) stacked in a cascode configuration is used for the system. However, if an abrupt voltage higher than a junction breakdown voltage of a parasitic bipolar junction transistor is applied to an I/O pad, the cascode configuration interface will function as a single FET due to a turn-on phenomenon of the BJT, and thus reliability issue occurs.

SUMMARY

According to one embodiment, a semiconductor structure is provided, comprising a first field-effect transistor (FET), a second FET, an isolation structure, and a body electrode. The first FET comprises a first active body having a first type conductivity. The second FET comprises a second active body having the first type conductivity. The first active body and the second active body are isolated from each other by the isolation structure. The body electrode has the first type conductivity and formed in the second active body.

According to another embodiment, an integrated circuit is provided, comprises a first voltage terminal, a second voltage terminal, a first FET, a second FET, an isolation structure, and a body electrode. The first FET and the second FET are electrically connected in series with a common electrode, and between the first voltage and the second voltage. The isolation structure isolates an active body of the first FET from active body of the second FET. The body electrode is coupled to the active body of the second FET.

DETAILED DESCRIPTION

Figure 1:
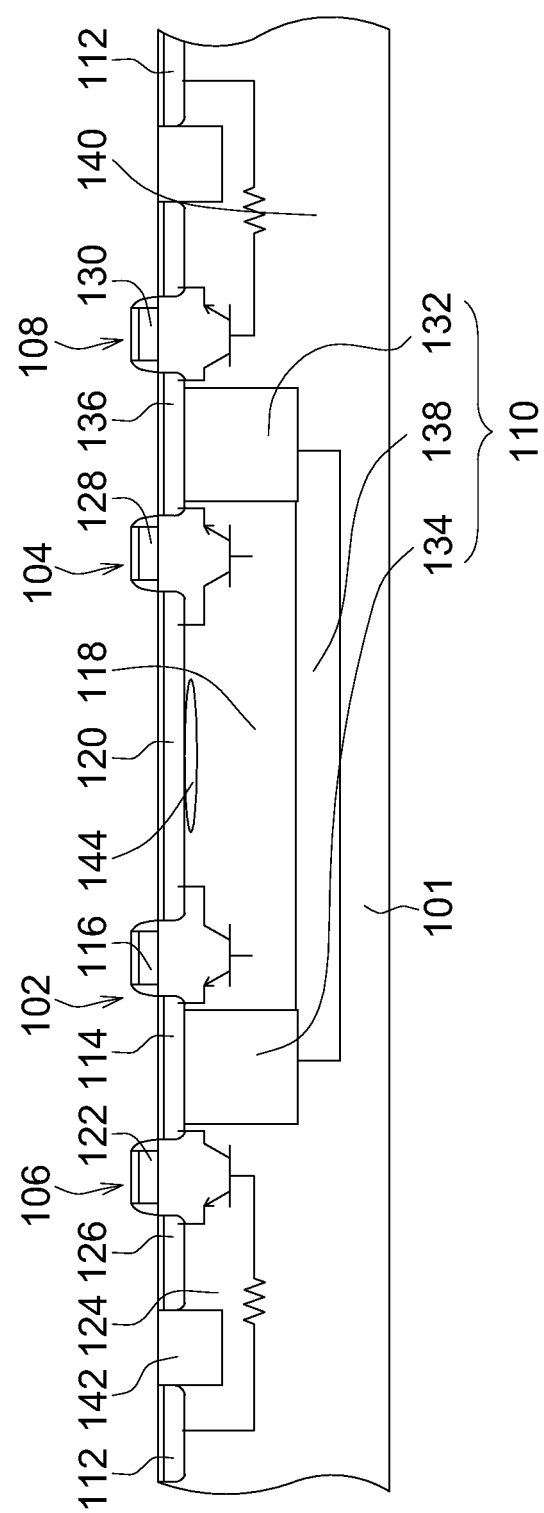
FIG. 1 illustrates a cross-section view of a semiconductor structure according to one embodiment.
Figure 2:
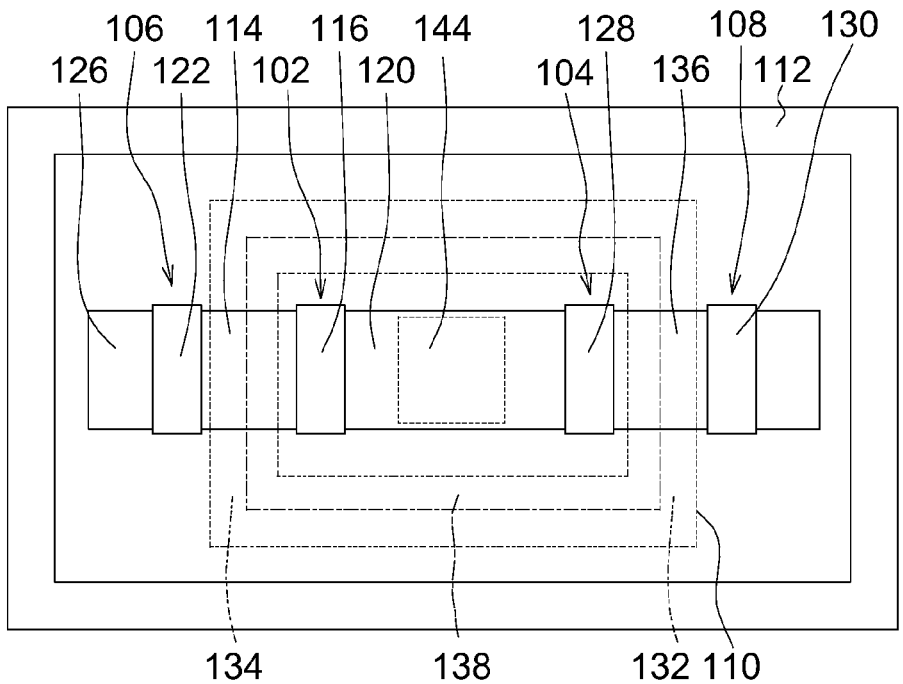
FIG. 2 illustrates a top view of a semiconductor structure according to one embodiment.

Referring to FIG. 1 and FIG. 2, respectively illustrating a cross-section view and a top view of a semiconductor structure according to one embodiment, the semiconductor comprising a first field-effect transistor (FET) 102, a first FET 104, a second FET 106, a second FET 108, an isolation structure 110, and a body electrode 112.

For example, the first FET 102 and the second FET 106 comprises a common electrode 114. The first FET 102 comprises a first gate 116 on a first active body 118 between the first source/drain 120 and the common electrode 114. The second FET 106 comprises a second gate 122 on a second active body 124 between a second source/drain 126 and the common electrode 114. In one embodiment, the first active body 118 and the second active body 124 have a first type conductivity. The common electrode 114, the first source/drain 120 and the second source/drain 126 may comprise heavily-doped regions having a second type conductivity opposite to the first type conductivity, or further having silicide layers thereon, respectively.

In one embodiment, the first FET 102 and the second FET 106 are NFETs, in other words, the first type conductivity is P type conductivity and the second conductivity is N type conductivity. For example, the second active body 124 is a P-well on a P substrate 101. In one embodiment, the first source/drain 120 functions as a (first) drain and the common electrode 114 functions as a (first) source for the first FET 102. The second source/drain 126 functions as a (second) source and the common electrode 114 functions as a (second) drain for the second FET 106. The substrate 101 may comprise a SOI substrate, etc.

Characteristics of the first FET 104 and/between the second FET 108 are similar with the characteristics of the first FET 102 and/between the second FET 106, and therefore are not described for the sake of brevity. The first active body 118 is a common active body for the first FET 102 and the first FET 104. In one embodiment, the first source/drain 120 between the first gate 116 and a first gate 128 is a common drain for the first FET 102 and the first FET 104. The second gate 122 of the second FET 106 and the second gate 130 of the second FET 108 are separated from each other by the isolation structure 110.

The isolation structure 110 comprises side portions 132 and 134 under the common electrode 114 and a common electrode 136, and a lower portion 138 between the side portions 132 and 134, and surrounds the first active body 118 of the first FETs 102 and 104 so as to isolate the first active body 118 from the second active body 124 of the second FET 106 and a second active body 140 of the second FET 108. In one embodiment, the side portions 132, 134 and the lower portion 138 are doped regions of the second type conductivity, such as an N-well or a deep N-well, opposing to the conductivity of the first active body 118 and the second active bodies 124, 140. The side portions 132, 134 and the lower portion 138 of the isolation structure 110 and the common electrodes 114, 136 all having the same type conductivity are electrically connected to each other without a PN junction among which. In another embodiment, the side portions 132, 134 and the lower portion 138 may comprise an electrical insulating material, for example, comprising an oxide, a nitride, or an oxynitride, such as silicon oxide, silicon nitride, silicon oxynitride, hafnium oxide, hafnium silicon oxide, hafnium silicon oxynitride, aluminum oxide, lanthanum oxide, tantalum oxide, yttrium oxide, zirconium oxide, strontium titanate oxide, zirconium silicon oxide, hafnium zirconium oxide, strontium bismuth tantalate, lead zirconate titanate, and barium strontium titanate, titanium nitride, tantalum nitride, etc. The electrical insulating material may be formed by a shallow trench isolation (STI). The electrical insulating material may be formed by a chemical vapor deposition, a physical vapor deposition, an atomic layer deposition, or other suitable methods. Types of the side portions 132, 134 and the lower portion 138 may be varied according to actual demands. For example, in one embodiment, the side portions 132, 134 are the doped regions of the second type conductivity while the lower portion 138 has the electrical insulating material. In another embodiment, the side portions 132, 134 has the electrical insulating material while the lower portion 138 are the doped regions of the second type conductivity.

The body electrode 112 of the first type conductivity is formed in the second active bodies 124, 140. There is no PN junction between the body electrode 112 (pick-up contact) and the second active bodies 124, 140 of the second FETs 106, 108. The body electrode 112 may comprise a heavily-doped region, or further having a silicide layer thereon.

The first active body 118 of the first FETs 102, 104 is floated since it is isolated from the body electrode 112 by the isolation structure 110. As shown in FIG. 1, for example, a base (or the first active body 118) of a parasitic BJT generated in the first FET 102 is isolated from the body electrode 112 by the isolation structure 110, and therefore a junction breakdown of the parasitic BJT from a collector (the first source/drain 120) to the pick-up contact (body electrode 112) can be avoided, increasing voltage tolerance of the semiconductor structure for a mixed-voltage I/O interface.

For example, the body electrode 112 has a ring shape, the side portions (comprising the side portions 132, 134) of the isolation structure 110 form a hollow rectangular pattern, the lower portion 138 has a rectangular shape, from the top view as shown in FIG. 2, but are not limited thereto. An insulating structure 142 may be disposed between the body electrode 112 and the second source/drain 126. A doped layer 144 may be formed between the first active body 118 and the first source/drain 120. In one embodiment, the doped layer 144 has the first type conductivity and can be for enhancing the performance of electrostatic discharge (ESD).

Figure 3:
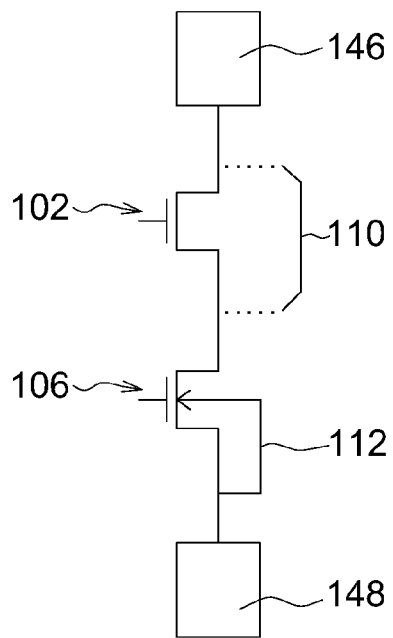
FIG. 3 shows an integrated circuit according to one embodiment.

FIG. 3 shows an integrated circuit according to one embodiment. For example, the first FET 102 and the second FET 106 are electrically connected in series with between a first voltage 146 and a second voltage 148. The body electrode 112 is coupled to the second FET 106 and is isolated from the first FET 102 by the isolation structure 110. In embodiments, for example, the first voltage 146 terminal is an I/O pad, and the second voltage 148 is a ground.

When the integrated circuit (semiconductor structure) according to embodiments is applied as a mixed-voltage I/O interface for a double operation voltage, it can suffer a higher applied voltage than a voltage that can be suffered by comparative examples in which two first and second FETs are isolated together by a single isolation structure, or two first and second FETs are respectively isolated by different isolation structures.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
a first field-effect transistor (FET) comprising a first active body having a first type conductivity;
a second FET comprising a second active body having the first type conductivity;
an isolation structure, wherein the first active body and the second active body are isolated from each other by the isolation structure; and
a body electrode having the first type conductivity and formed in the second active body, wherein the first FET and the second FET has a common electrode of a second type conductivity opposite to the first type conductivity, the isolation structure is under the common electrode.

2. The semiconductor structure according to claim 1, wherein the isolation structure comprises a side portion and a lower portion adjacent to the side portion.

3. The semiconductor structure according to claim 1, wherein the isolation comprises a doped region of the second type conductivity opposite to the first type conductivity or/and an electrical insulating material.

4. The semiconductor structure according to claim 3, wherein the isolation comprises the electrical insulating material comprising silicon oxide, silicon nitride, silicon oxynitride, hafnium oxide, hafnium silicon oxide, hafnium silicon oxynitride, aluminum oxide, lanthanum oxide, tantalum oxide, yttrium oxide, zirconium oxide, strontium titanate oxide, zirconium silicon oxide, hafnium zirconium oxide, strontium bismuth tantalate, lead zirconate titanate, and barium strontium titanate, titanium nitride, or tantalum nitride.

5. The semiconductor structure according to claim 1, wherein the first FET is surrounded by the isolation structure.

6. The semiconductor structure according to claim 1, wherein there is no PN junction between the body electrode and the second active body of the second FET.

7. The semiconductor structure according to claim 1, wherein
the first FET comprises a first gate, a first source and a first drain, the first gate is on the first active body between the first source and the first drain,
the second FET comprises a second gate, a second source and a second drain, the second gate is on the second active body between the second source and the second drain,
one of the first source and the first drain and one of the second source and the second drain are a common electrode.

8. The semiconductor structure according to claim 1, wherein the first FET and the second FET has a common electrode electrically connected to the isolation structure without a PN junction therebetween.

9. The semiconductor structure according to claim 1, wherein the first active body of the first FET is isolated from the body electrode by the isolation structure.

10. The semiconductor structure according to claim 7, further comprising an insulating structure between the body electrode and one of the second source and the second drain.

11. The semiconductor structure according to claim 1, wherein the first FET comprises a plurality of the first FET, the first active bodies of the first FETs is a common first active body surrounded by the isolation structure.

12. The semiconductor structure according to claim 1, wherein the first FET comprises a plurality of the first FETs, the isolation structure is under first sources/drains of the first FETs.

13. The semiconductor structure according to claim 1, wherein the first FET comprises a plurality of the first FETs, the plurality of the first FETs has a common first source/drain.

14. The semiconductor structure according to claim 13, further comprising a doped layer between the first active body and the common first source/drain of the plurality of the first FETs.

15. The semiconductor structure according to claim 14, wherein the doped layer has the first type conductivity, the common first source/drain has the second type conductivity opposite to the first type conductivity.

16. The semiconductor structure according to claim 1, wherein the second FET comprises a plurality of the second FETs, each of the second FETs comprises a second gate, a second source and a second drain, the second gate is on the second active body between the second source and the second drain, the second gates of the second FETs are separated from each other by the isolation structure.

17. An integrated circuit, comprising:
a first voltage terminal;
a second voltage terminal;
a first FET;
a second FET, wherein the first FET and the second FET are electrically connected in series with a common electrode, and between the first voltage and the second voltage;
an isolation structure isolating an active body of the first FET from an active body of the second FET, wherein the isolation structure is under the common electrode; and
a body electrode coupled to the active body of the second FET.

18. The integrated circuit according to claim 17, wherein the first voltage terminal and the second voltage terminal have different voltages.

19. The integrated circuit according to claim 17, wherein the first voltage terminal is I/O pad, the second voltage is a ground.

* * * * *